United States Patent [19]

Nakada

[11] Patent Number: 4,870,621
[45] Date of Patent: Sep. 26, 1989

[54] DUAL PORT MEMORY DEVICE WITH IMPROVED SERIAL ACCESS SCHEME

[75] Inventor: Kazuhiro Nakada, Tokyo, Japan

[73] Assignee: NEC Corporation, Tokyo, Japan

[21] Appl. No.: 127,022

[22] Filed: Nov. 27, 1987

[30] Foreign Application Priority Data

Nov. 27, 1986 [JP] Japan ................................. 61-284811

[51] Int. Cl.4 ............................................ G11C 13/00
[52] U.S. Cl. ................................ 365/230.05; 365/219; 365/220; 365/230.09
[58] Field of Search ................ 365/189, 219, 220, 221, 365/230

[56] References Cited

U.S. PATENT DOCUMENTS 4,633,441 12/1986 Ishimoto ............................. 365/189
4,688,197 8/1987 Novak et al. ....................... 365/230
4,723,226 2/1988 McDonough et al. ............. 365/189

Primary Examiner—Joseph A. Popek
Attorney, Agent, or Firm—Sughrue, Mion, Zinn, Macpeak & Seas

[57] ABSTRACT

A dual port memory which enables consecutive access operations from an arbitrary column address and is fabricated on a reduced area of a semiconductor chip. The memory includes a memory array, a random access peripheral circuit for effecting random access to the array and having a column decoder, and a serial access peripheral circuit having a shift register for serially selecting the columns of the array and a control circuit for determining the state of the shift register in accordance with the output of the column register.

7 Claims, 5 Drawing Sheets

DUAL PORT MEMORY DEVICE WITH IMPROVED SERIAL ACCESS SCHEME

BACKGROUND OF THE INVENTION

The present invention relates to a memory circuit and more particularly to a dual port memory circuit.

Random access memories (RAMs) utilizing the LSI technique have been used mainly as the main memories of computers and have come into widespread use in office automation devices, such as personal computers. Due to the remarkable reduction in the cost per bit of storage, MOS random access memories are used for processing video images, especially for displaying image on a CRT. A memory device used with such a display is connected between a CPU and the CRT. The CPU communicates with the RAM on a random access basis and supplies the display information to the RAM. The memory access time depends upon the speed of the CPU. Data transfer from the memory to the CRT is performed on a line-by-line sequential basis rather than on a random access basis. Moreover, the speed of such data transfer depends upon the display size of the CRT. Namely, the speed is determined in dependence upon the required resolution of the CRT. At present, the display size of a CRT frequently used in personal computers of 8-bit type is $640 \times 400$ dots (=256,000 dots) in one frame, and a cycle time of about 45 NS is required per dot.

The RAM for data display will hereinafter be referred to as a "VRAM". At present, such devices are inefficient for display applications. During the display period of the CRT, the data is sent to the CRT continuously at the data rate of 45 NS. During this period, the RAM cannot exchange data with the CPU so that the CPU can neither rewrite nor read the content of the VRAM. The data exchange between the VRAM and the CPU is limited to the blanking period during which no image is displayed on the CRT. As a result, the CPU and the system efficiency is remarkably low.

It has been proposed that RAMs having an input/output system for a CPU and an output system for a CRT are the best suitable for use as a VRAM. Such RAMs are called a "dual port memory".

A known dual port memory is structured such that a shift register is provided to the known RAM and a serial read operation to the CRT is performed via the shift register while performing the usual random access operation by the commonly provided input/output port of the RAM. However, according to such dual port memory, the order of serial read operations through the shift register is fixed. Namely, the serial read operation is always started from the first bit of the shift register, which first bit is located at the bit position closest to the output terminal and advanced towards the final bit of the shift register, which final bit is located at the bit position farthest from the output terminal.

In order to obviate the above problem, it has been proposed an improved dual port memory in which the serial read operation can be started from an arbitrary bit location. The details of this improved dual port memory is described in U.S. Pat. No. 4,633,441 issued to Ishimoto.

However, a counter or a shift register and a decoder for deciding a start bit position in accordance with column address information must be provided in the serial access port to achieve the above feature and therefore, an additional area for the counter and the decoder must be provided on a semiconductor chip on which the memory is formed, is necessitated to enlarge the whole size of the chip. This lowers the yields of the memories. Also, the above memory cause a large power consumption.

SUMMARY OF THE INVENTION

It is an object of the present invention to provide a dual port memory formed on a reduced area of a semiconductor chip.

It is another object of the present invention to provide a dual port memory operable with a reduced amount of power consumption.

The dual port memory according to the present invention is of the type having a memory cell array arranged in rows and columns, a random access peripheral circuit for performing random access operation with respect to the memory cell array in response to row and column address information, and a serial access peripheral circuit for serially accessing the columns of the array in response to shift clocks. The random access port includes a column decoder whose output is used to select a part of columns and the above serial access peripheral circuit includes a shift register whose output is used to select the columns serially and a control circuit for operatively determining the state of the shift register by the output of the column decoder in the random access peripheral circuit.

According to the present invention, the column decoder in the random access peripheral circuit is also used to determine a start position of the shift register. In other words, the column decoder is shared by both the random access peripheral circuit and the serial access peripheral circuit. Therefore, the area of the memory on a semiconductor chip can be reduced and power consumption caused by the column decoder in the serial access peripheral circuit is avoided.

DETAILED DESCRIPTION OF THE DRAWINGS

DETAILED DESCRIPTION OF THE INVENTION

Figure 1:
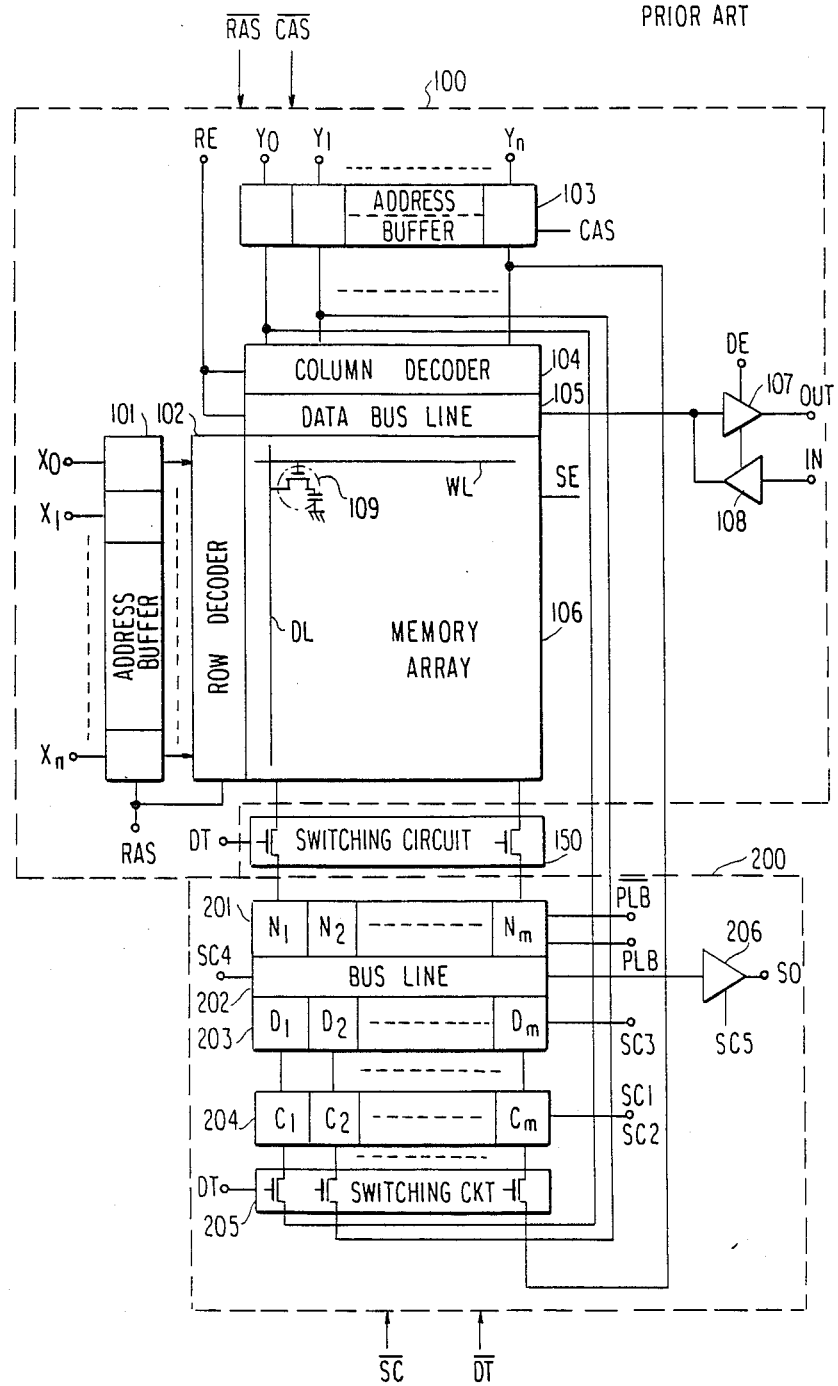
FIG. 1 is a schematic block diagram of a dual port memory according to a prior art.
Figure 2:
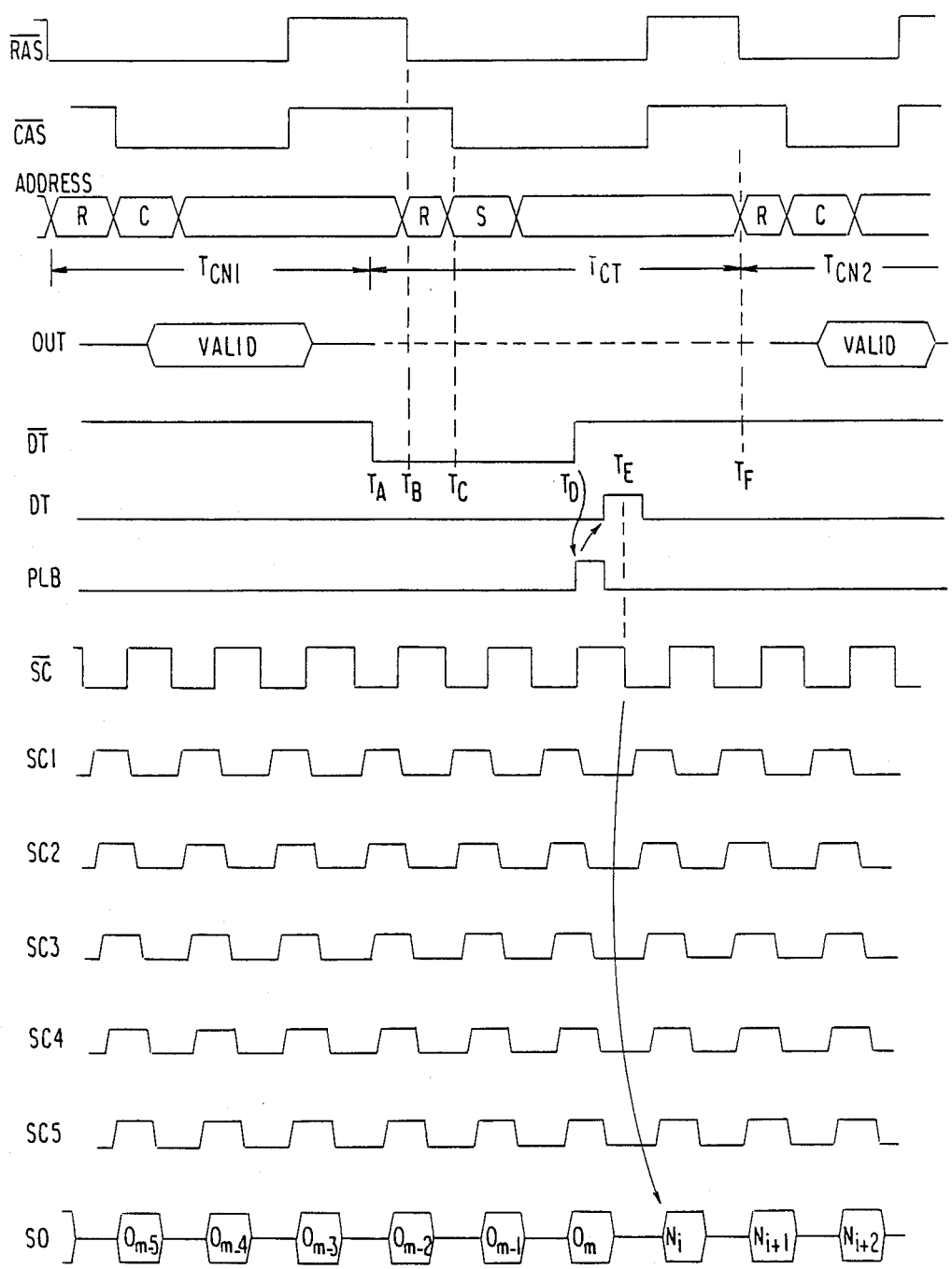
FIG. 2 is a timing diagram showing operation of the memory of FIG. 1.

Referring to FIGS. 1 and 2, a dual port memory described in the above U.S. Patent specification is described.

As shown in FIG. 1, A RAM unit 100 is identical to the ordinary RAM. A row address buffer 101 receives row address inputs $X_0$, $X_1$, . . . , and $X_n$, and a row decoder 102 selects a word line of a memory cell array 106 in response to the outputs of the buffer 101 under control of a control signal RAS. A column address buffer 103 receives column address inputs $Y_0$, $Y_1$, . . . , and $Y_n$, and a column decoder 104 connects a selected bit line with a data bus line 105 in response to RE. An output buffer 107 is controlled by a control signal DE to extract the data of the data bus line as an output OUT. An input buffer 108 is used for writing an input data IN to the data bus line 105 when a write operation is performed. By the actions of a row address buffer 101 and a row decoder 102, an arbitrary word line WL of a cell array 106 is selected in accordance with the levels of the row address inputs $X_0$, $X_1$, ..., and $X_n$. After the selection of the predetermined word line WL, there is established on digit lines DL intersecting the selected word line voltage differences which correspond tot he stored levels of cells 109 and such voltage differences are amplified to the low or high level by the conventional sensing operation. The selection of the column lines are conducted similarly, under control of a column address buffer 103 and a column decoder 104. In accordance with the column decoder output, the selected bit line is connected with an I/O bus line 105 so that the individual functions are executed by an input buffer 108 for a write operation and an output buffer 107 for a read operation.

A serial unit 200 is constructed of a line register 201 as a temporary memory, a serial address selecting counter 204, a serial decoder 203 for selecting one stage in the line register in response to the output of the counter 204, a read bus line 202 from which a logic level stored in the register 201 is to be read out, and an output buffer 206. The output from the column address buffer 103 is connected through switching circuit 205 to the counter 204 so as to initialize the counter.

In this case, the register 201 is an m-bit register having memory units $N_1$, $N_2$, ..., and $N_m$ in correspondence with the m digit lines or columns DL. The decoder 203 has m decoding units $D_1$ to $D_m$, each corresponding to an associated one of the memory units $N_1$ to $N_m$. The counter 204 is an n-bit counter having stages $C_1$ to $C_n$ and is capable of counting from 0 to $2^n$, where $2^n \geq m$.

A switching circuit 150 is composed of "n" FET switches and operates to transfer the data on the digit lines to the register 201 in response to an active level of a control signal DT. Similarly, the switching circuit 205 transfers column address signals from the buffer 103 to the counter 204 in response to the active level of the signal DT, thereby to set the initial counting state of the counter 204. The counting state of the counter 204 is advanced one by one in synchronism with a system clock $\overline{SC}$.

In the memory as illustrated, the known multi-strobe addressing technique is employed wherein the row address inputs and the column address inputs are incorporated through the same set of address terminals in response to a row address strobe signal $\overline{RAS}$ and a column address strobe signal $\overline{CAS}$, respectively. A transfer control signal $\overline{DT}$ is the signal for rewriting the contents of the register 201, and the system clock signal $\overline{SC}$ is used to control the serial unit 200, especially the serial read-out operation thereof.

With reference to FIG. 2, operations of the memory of FIG. 2 will be explained. As a starting point in the explanation it will be assumed that the register 201 was previously loaded with data that is being serially read out, the last bit to be read out being the one initially set in the stage $O_m$ (as shown in FIG. 1).

Before a time point $T_A$, the signal $\overline{DT}$ is kept at a high level (inactive level) and the RAM unit 100 performs a normal random access operation for a period TCN1. Namely, the row address R and the column address C are incorporated in response to the low levels of $\overline{RAS}$ and $\overline{CAS}$, respectively, and a read or write operation is carried out conventionally via buffers 107 and 108 and bus line 105. Also, during this period TCN1, the data previously stored in register 201 is sequentially read out in response to the low level of system clocks $\overline{SC}$. Namely, in response to the low level of $\overline{SC}$, signals SC1 to SC5 are generated which control, respectively, the counter 204, decoder 203, bus line 202 and the buffer 206 as illustrated in FIG. 2. The output state of the decoder 203 is advanced one by one in response to $\overline{SC}$ so that the units of the register 201 corresponding to the output of the decoder 203 generate the data to the bus line 202.

At the time point $T_A$, the signal $\overline{DT}$ changes from the high level to the low level (active level) to begin the transfer operation. The signals $\overline{RAS}$ and $\overline{CAS}$ become active (low) levels at time points $T_B$ and $T_C$, respectively, to incorporate the row and column addresses R and C. When $\overline{DT}$ goes to the low level, the operation for renewing the contents of the register 201 begins. Namely, the data transfer cycle period $T_{CT}$ is introduced. During this time, it is not required that the data OUT from the RAM unit 100 is generated.

At time $T_B$, $\overline{RAS}$ becomes active and the memory cells coupled to the word line designated by the row address R are subjected to the conventional refresh operation, which is the same as that in the normal cycle period TCN1, so that the data signals to be transferred appear on the respective digit lines. In this case, the column address C set by $\overline{CAS}$ is intended to be used only for setting the initial state of the counter 204 as will be explained in the following.

Meanwhile the serial unit 200 continues the serial read operations as illustrated by $O_{m-2}$, $O_{m-1}$ and $O_m$ in response to the low level of the signal $\overline{SC}$ and completes the read-out by a time point $T_D$, at which the signal $\overline{DT}$ changes to the high level. It will be appreciated that the control signal $\overline{DT}$ and the system clock $\overline{SC}$ are synchronized externally of the circuit illustrated so as to occur at the time relation shown.

Up to time point $T_D$, the switching circuits 150 and 205 are in the inactive state. At time $T_D$, in response to the change of $\overline{DT}$ to the high level, a precharge signal PLB for the register 201 is made active and resets the register 201. That is, the register 201 is precharged and made ready for receiving new data from the digit lines. Then in response to the high level of the signal PLB, the signal DT becomes high and enables switching circuits 150 and 205. Consequently, the column address C is transferred to the counter 204 to set the initial state thereof while the read-out signals on the digit lines are written into the memory units $N_1$ to $N_m$ of the register 201.

However, in the above dual port memory, the serial unit 200 is composed of a relatively large number of circuits such as the counter 204 and the decoder 203. Particularly, the each stage ($D_1 ... D_m$) of the decoder 203 includes at least "n" transistors receiving "n" outputs of the counter 204 and the decoder 203 necessitates the transistors more than "n"×"m" in number. As a result, it has been difficult to fabricate a dual port memory on a small area of a semiconductor chip. Furthermore, power consumption in the serial unit 200 is large.

Figure 3:
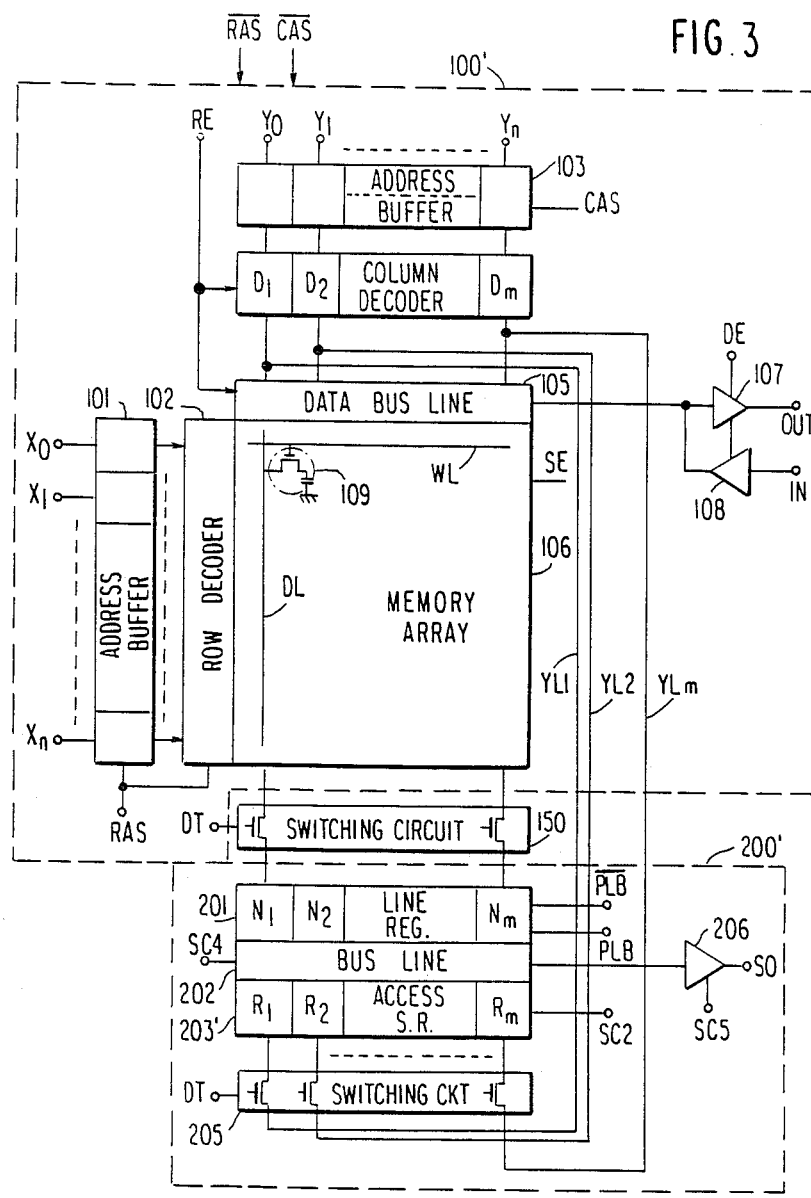
FIG. 3 is a schematic diagram showing a dual port memory according to one embodiment of the present invention.
Figure 4:
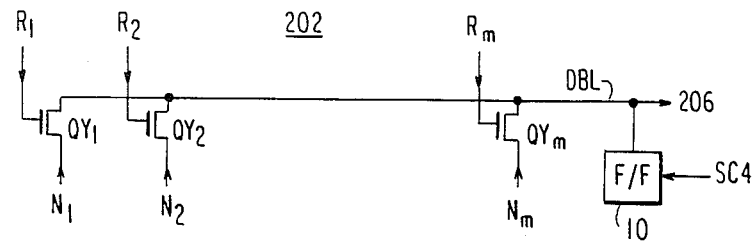
FIG. 4 is a schematic circuit diagram of the bus line section in the memory of FIG. 3.

Referring to FIGS. 3 and 4, a dual port memory according to one embodiment of the invention is explained.

In FIG. 3, the portions or elements corresponding to those in FIG. 1 are designated by the same or similar references.

The memory according to the embodiment is achieved by replacing the decoder 203 and the n-stage counter 204 in FIG. 1 by an m-stage access shift register 203', as shown in FIG. 3. The access shift register 203' has "m" shift stages and is controlled to shift the position of "1" output from the left side towards the right side in synchronism the signal SC2.

The respective outputs ($R_1$-$R_m$) of the shift register 203' are applied to the bus line section 202 and used to selectively transfer one of the stages $N_1$-$N_m$ of the register 201 to the output circuit 206.

One example of the bus line section 202 is shown in FIG. 4.

The buffer section 202 includes "m" transfer gate transistors $QY_1$-$QY_m$ receiving the outputs of the stages $R_1$-$R_m$ of the shift register 203' at their gates, respectively and coupled between a data bus line DBL coupled to an input of the output circuit 206 and the outputs of the respective stages $N_1$-$N_m$ of the line register 201.

In this embodiment, the "m" outputs of the column decoder 104 are applied to the shift register 203' via signal lines $YL_1$-$YL_m$ and the switch circuit 205 to determine a start position of the shift register 203' in accordance with the output state of the column decoder 104.

Thus, the decoder (203 in FIG. 1) is eliminated from the serial unit 200' by sharing the column decoder 104 in the RAM unit 100'. Therefore, the space for fabricating the serial unit 200' can be greatly reduced, and power consumption necessitated by the decoder 203 is also avoided.

In the embodiment, the signal lines $YL_1$-$YL_m$ are formed in place of the signal lines connected between the address buffer 103 and the switching circuit 205 of FIG. 1, and it might be conceived that the number of the signal lines is relatively large. However, different from active elements such as transistors forming the decoder 203 in FIG. 1, the signal lines $YL_1$-$YL_m$ can be formed by multi-layer wiring technique and formed with overlap with transistors or other wirings. Thus, the increase in number of the signal lines $YL_1$-$YL_m$ is not obstacle in increasing density of the memory.

THe operation of the memory shown in FIG. 3 is substantially the same as that of the memory in FIG. 1, and the chart of FIG. 2 is similarly applicable to the operation of the memory of FIG. 3 but the signal SC3 is not necessary in this case.

Figure 5:
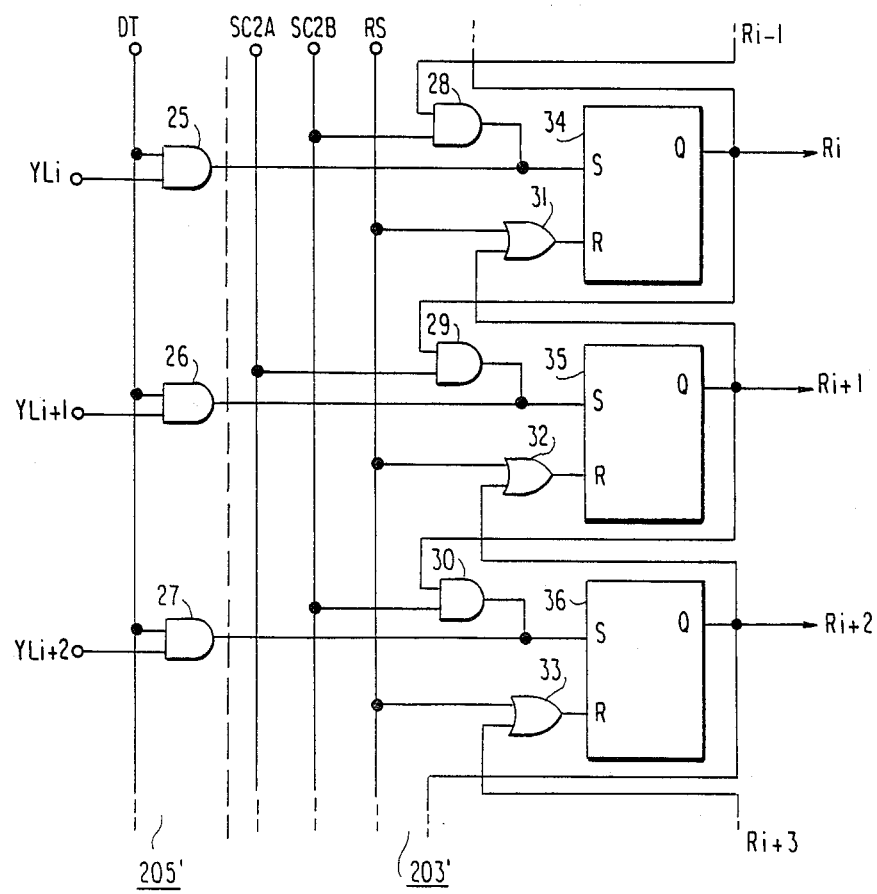
FIG. 5 is a schematic block diagram showing an example of the switching circuit and the shift register in FIG. 3.
Figure 6:
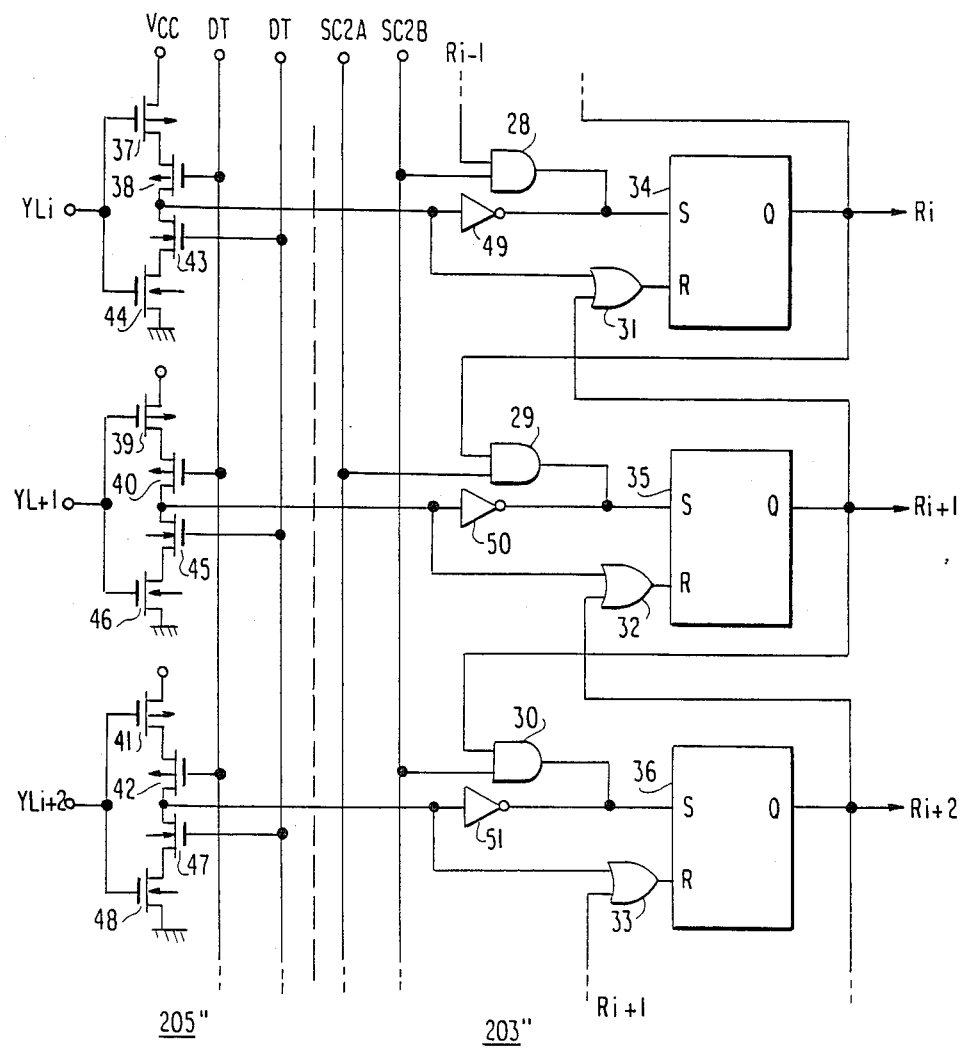
FIG. 6 is a schematic block diagram showing another example of the switching circuit and the shift register.

Referring to FIGS. 5 and 6, other examples of the switch circuit 205 and detailed examples of the shift register 203 are explained.

In the case of FIG. 5, the switching circuit 205' includes a plurality of AND gates such as 25, 26, 27 coupled the control signal DT and the signal lines $YL_i$-$YL_{i+2}$, respectively. The shift register 203' includes a plurality of flip-flops 34–36. A reset signal line RS is connected to reset terminals of the respective flip-flops via OR gates 31, 32, 33 which also receive the outputs of the succeeding stages, respectively. True and complementary shift signal lines SC2A and SC2B are coupled to inputs of AND gates 28, 29, 30 alternatively, as shown. The AND gates 28–30 also receive inputs coupled to the preceding stage outputs, respectively.

In operation, the reset signal line RS is first set at a high level so that all the flip-flops are reset to be initialized. Then, the control line DT is raised to a high level so that the outputs ($YL_i$, $YL_{i+1}$, $YL_{i+2}$) of the column decoder 104 are applied to set terminals of the flip-flops so that only one of the flip-flops is set to produce "1" output with others "0" outputs. Then, "1" output state is shifted to the succeeding stage in response to active level of SC2A and SC2B one by one.

In the example of FIG. 6, the switch circuit 205" includes a plurality of CMOS gates each receiving one of the column decoder outputs $YL_i$, true and complementary control signals DT and $\overline{DT}$. When DT and $\overline{DT}$ are at high and low levels respectively, each of the CMOS gates operates as an inverter with respect to its input e.g. $YL_i$. Thus, the levels of the respective inputs $YL_i$, $YL_{i+1}$, $YL_{i+2}$ are inverted by the CMOS gates and applied to the reset terminals R of the respective flip-flops via the OR gates 31, 32, 33, respectively and further inverted by inverters 49, 50, 51 and their outputs are applied to the set terminals S of the flip-flops. In this example, the inverted signals of $YL_i$, $YL_{i+1}$, $YL_{i+2}$ are applied to the reset terminals R of the flip-flops. Therefore, when DT and $\overline{DT}$ are at high and low levels, the shift register 203" is automatically initialized and set in a start position.

I claim:

1. A dual port memory comprising a memory cell array including memory cells arranged in rows and columns; a random access peripheral circuit for performing a random access operation with respect to said cell array in response to row and column address information; and a serial access peripheral circuit performing consecutive access operations with respect to the columns of said array in response to shift pulses; said random access peripheral circuit including a row decoder for operatively selecting one of said rows in accordance with the row address information, a column address buffer responsive to column address signals indicative of the column address information for generating internal column address signals, a column decoder having a plurality of decode outputs, each of said decode outputs being used to designate each of the columns of said array, said column decoder operatively selecting one of said decode outputs in accordance with said internal column address signals, said serial access peripheral circuit including a shift register having a plurality of shift stages whose outputs are used for serially designating the columns in said array, a switching circuit having a plurality of switch elements connected between said decode outputs of said column decoder and said shift stages of said shift register for operatively applying the states of said decode outputs to said shift stages thereby to determine the states of said shift stages in accordance with said decode outputs when enabled, and control means for operatively enabling said switching circuit thereby to set one of said shift stages of said shift register at a selected state in accordance with said decode outputs of said column decoder of said random access peripheral circuit.

2. The memory according to claim 1, wherein each of said switch elements includes a first transfer circuit for operatively applying one of the decode outputs of said column decoder to one of said shift stages thereby to determine the state of said shift register.

3. The memory according to claim 1, further comprising a plurality of data store circuits, each of said data store circuits operatively storing data on the associated one of said columns.

4. The memory according to claim 3, further comprising a data transfer circuit coupled between said columns of said array and said data store circuits for operatively connecting the data on said columns of said data store circuits.

5. A dual port memory comprising a memory cell array including word lines arranged in rows, digit lines arranged in columns normal to the rows, and a plurality of memory cells coupled to said word lines and said digit lines; a random access peripheral circuit for performing a random access operation with respect to said cell array in accordance with row address information and column address information, said random access peripheral circuit including a row address buffer responsive to row address signals indicative of the row address information for generating internal row address signals, a row decoder responsive to said internal row address signal for selecting one of said word lines thereby to render the memory cells of the selected word line accessible through said digit lines, a column address buffer responsive to said internal row address signal for selecting one of said word lines thereby to render the memory cells of the selected word line accessible through said digit lines, a column address buffer responsive to column address signals for generating internal column address signals, and a column decoder having a plurality of decode outputs, said column decoder selecting one of said decode outputs in response to said internal column address signals thereby to select at least one of the digit lines through which a selective access operation is performed; and a serial access peripheral circuit performing serial access operations with respect to the digit lines of said array in response to shift pulses, said serial access peripheral circuit including a line register having a plurality of storage units, a first transfer circuit having a plurality of first transfer gates connected between said digit lines and said storage units, a shift register having a plurality of shift stages, a bus line, a selection circuit coupled to said line register, said bus line and said shift register for applying data stored in one of said storage units to said bus line in accordance with the state of said shift register, a serial output circuit coupled to said bus line for outputting data at said bus line, a second transfer circuit having a plurality of second transfer gates connected between said decode outputs of said column decoder and said shift stages, and control means for enabling said second transfer gates simultaneously thereby to make one of said shift stages in a selected state in accordance with the states of said decode outputs.

6. The memory according to claim 5, in which the number of said decode outputs, the number of said storage units and the number of said shift stages are equal to each other.

7. The memory according to claim 5, in which said selection circuit includes a plurality of data transfer gates connected between said storage units and said bus line.

* * * * *

UNITED STATES PATENT AND TRADEMARK OFFICE
CERTIFICATE OF CORRECTION

PATENT NO. : 4,870,621

DATED : September 26, 1989

INVENTOR(S) : Kazuhiro NAKADA

It is certified that error appears in the above-identified patent and that said Letters Patent is hereby corrected as shown below:

Column 3, line 13, delete "tot he" and insert --to the--;

Column 4, line 38, delete "$O_m^-$ and" and insert --$O_{m-1}$ and--.

Signed and Sealed this

Twenty-third Day of October, 1990

Attest:

HARRY F. MANBECK, JR.

*Attesting Officer*  *Commissioner of Patents and Trademarks*